(12) United States Patent
Chechik et al.

(10) Patent No.: US 8,647,811 B2
(45) Date of Patent: Feb. 11, 2014

(54) POSITIVE-WORKING LITHOGRAPHIC PRINTING PLATE PRECURSORS

(75) Inventors: Helena Chechik, Petach-Tikva (IL); Larisa Postel, Ashdod (IL); Tanya Kurtser, Petach Tiqwa (IL); Marina Rubin, Petah-Tikva (IL); Moshe Levanon, Ness-Ziona (IL)

(73) Assignee: Eastman Kodak Company, Rochester, NY (US)

( * ) Notice: Subject to any disclaimer, the term of this patent is extended or adjusted under 35 U.S.C. 154(b) by 70 days.

(21) Appl. No.: 13/348,674

(22) Filed: Jan. 12, 2012

(65) Prior Publication Data

US 2013/0183622 A1    Jul. 18, 2013

(51) Int. Cl.
| | |
|---|---|
| *B41F 7/00* | (2006.01) |
| *B41N 1/00* | (2006.01) |
| *B41M 5/00* | (2006.01) |
| *G03F 7/00* | (2006.01) |
| *G03F 7/26* | (2006.01) |

(52) U.S. Cl.
USPC .......... 430/270.1; 430/271.1; 430/283.1; 430/302; 101/450.1; 101/453; 101/463.1

(58) Field of Classification Search
USPC ............ 430/270.1, 271.1, 283.1, 302; 101/450.1, 453, 463.1
See application file for complete search history.

(56) References Cited

U.S. PATENT DOCUMENTS

| | | | |
|---|---|---|---|
| 6,255,033 B1 | 7/2001 | Levanon et al. | |
| 6,541,181 B1 | 4/2003 | Levanon et al. | |
| 6,806,019 B2 | 10/2004 | Takahashi | |
| 7,399,576 B1 | 7/2008 | Levanon | |
| 7,544,462 B2 | 6/2009 | Levanon et al. | |
| 7,955,779 B2 | 6/2011 | Levanon et al. | |
| 2005/0003296 A1 | 1/2005 | Memetea et al. | |
| 2005/0158663 A1* | 7/2005 | Tabuchi et al. | 430/300 |
| 2009/0004599 A1 | 1/2009 | Levanon et al. | |
| 2009/0162783 A1* | 6/2009 | Levanon et al. | 430/281.1 |
| 2009/0197052 A1 | 8/2009 | Levanon et al. | |
| 2009/0202948 A1* | 8/2009 | Simpson et al. | 430/302 |
| 2009/0291387 A1 | 11/2009 | Levanon et al. | |
| 2010/0047723 A1 | 2/2010 | Levanon et al. | |
| 2011/0059399 A1 | 3/2011 | Levanon et al. | |
| 2012/0125216 A1* | 5/2012 | Levanon et al. | 101/453 |
| 2012/0129093 A1* | 5/2012 | Levanon et al. | 430/116 |
| 2012/0129095 A1* | 5/2012 | Levanon et al. | 430/270.1 |

OTHER PUBLICATIONS

U.S. Appl. No. 12/948,808, filed Nov. 18, 2010, titled Methods of Processing Using Silicate-Free Developer Compositions, by Moshe Levanon, et al.
U.S. Appl. No. 12/948,812, filed Nov. 18, 2010, titled Silicate-Free Developer Compositions, by Moshe Levanon, et al.
U.S. Appl. No. 12/948,814, filed Nov. 18, 2010, titled Silicate-Free Developer Compositions, by Moshe Levanon, et al.

* cited by examiner

*Primary Examiner* — Chanceity Robinson
(74) *Attorney, Agent, or Firm* — J. Lanny Tucker

(57) ABSTRACT

A positive-working lithographic printing plate precursor has an outermost imageable layer that is present at a dry coverage weight of at least 0.7 $g/m^2$ and up to and including 1.6 $g/m^2$ and comprises a primary polymeric binder comprising recurring units of a hydroxyaryl acetal or a hydroxyaryl ester, or recurring units of both a hydroxyaryl acetal and a hydroxyaryl ester. The outermost imageable layer also contains an alkali-soluble secondary vinyl polymer that is not a primary polymeric binder and a non-polymeric polyhydric phenol. These precursors comprise an infrared radiation absorber to make them sensitive and imageable using infrared radiation. After imaging, the precursors can be processed (developed) using an relatively low pH developer such as a silicate- or metasilicate-free developer.

20 Claims, No Drawings

POSITIVE-WORKING LITHOGRAPHIC PRINTING PLATE PRECURSORS

FIELD OF THE INVENTION

This invention relates to positive-working lithographic printing plate precursors. In particular, these precursors comprise a unique combination of polymers and non-polymeric additive in the outermost imageable layer. This invention also provides a method for making lithographic printing plates from these precursors.

BACKGROUND OF THE INVENTION

In lithographic printing, ink receptive regions, known as image areas, are generated on a hydrophilic surface. When the surface is moistened with water and ink is applied, the hydrophilic regions retain the water and repel the ink the ink receptive regions accept the ink and repel the water. The ink is then transferred to the surface of suitable materials upon which the image is to be reproduced. In some instances, the ink can be first transferred to an intermediate blanket that in turn is used to transfer the ink to the surface of the materials upon which the image is to be reproduced.

Lithographic printing plate precursors useful to prepare lithographic (or offset) printing plates typically comprise one or more imageable layers applied over a hydrophilic surface of a substrate (or intermediate layers). The imageable layer(s) can comprise one or more radiation-sensitive components dispersed within a suitable binder. Following imaging, either the exposed regions or the non-exposed regions of the imageable layer(s) are removed by a suitable developer, revealing the underlying hydrophilic surface of the substrate. If the exposed regions are removed, the lithographic printing plate precursor is considered as positive-working. Conversely, if the non-exposed regions are removed, the lithographic printing plate precursor is considered as negative-working. In each instance, the regions of the imageable layer(s) that remain are ink-receptive, and the regions of the hydrophilic surface revealed by the developing process accept water or aqueous solutions (typically a fountain solution), and repel ink.

Similarly, positive-working compositions can be used to form resist patterns in printed circuit board (PCB) production, thick-and-thin film circuits, resistors, capacitors, and inductors, multichip devices, integrated circuits, and active semi-conductive devices.

"Laser direct imaging" methods (LDI) have been known that directly form an offset lithographic printing plate or printing circuit board using digital data from a computer, and provide numerous advantages over the previous processes using masking photographic films. There has been considerable development in this field from more efficient lasers, improved imageable compositions and components thereof.

Positive-working imageable compositions containing novolak or other phenolic polymeric binders and diazoquinone imaging components have been prevalent in the lithographic printing plate and photoresist industries for many years. Imageable compositions based on various phenolic resins and infrared radiation absorbing compounds are also well known.

Thermally imageable, single- or multi-layer lithographic printing plate precursors are also described in, for example, WO 97/39894 (Hoare et al.), WO 98/42507 (West et al.), WO 99/11458 (Ngueng et al.), U.S. Pat. Nos. 5,840,467 (Kitatani), 6,060,217 (Ngueng et al.), 6,060,218 (Van Damme et al.), 6,110,646 (Urano et al.), 6,117,623 (Kawauchi), 6,143,464 (Kawauchi), 6,294,311 (Shimazu et al.), 6,352,812 (Shimazu et al.), 6,593,055 (Shimazu et al.), 6,352,811 (Patel et al.), 6,358,669 (Savariar-Hauck et al.), and 6,528,228 (Savariar-Hauck et al.), and U.S. Patent Application Publications 2002/0081522 (Miyake et al.) and 2004/0067432 A1 (Kitson et al.).

Positive-working thermally imageable elements containing thermally-sensitive polyvinyl acetals are described in U.S. Pat. Nos. 6,255,033, 6,541,181 (both Levanon et al.), 7,399,576 (Levanon et al.), 7,544,462 (Levanon et al.), and 7,955,779 (Levanon et al.), WO 04/081662 (Memetea et al.), and U.S. Patent Application Publications 2009/0004599 (Levanon et al.), 2009/0162783 (Levanon et al.), 2009/0197052 (Levanon et al.), 2009/0291387 (Levanon et al.), and 2010/0047723 (by Levanon et al.).

Other useful positive-working lithographic printing plate precursors that can be processed using silicate-free processing solutions are described in copending and commonly assigned U.S. Ser. No. 12/948,808 (filed Nov. 11, 2010 by Levanon, Huang, and Askadsky), Ser. No. 12/948,812 (filed Nov. 11, 2010 by Levanon and Askadsky), and Ser. No. 12/948,814 (filed Nov. 11, 2010 by Levanon and Askadsky).

Offset printing plates recently have been the subject of increasing performance demands with respect to imaging sensitivity (imaging speed) and image resolution as well as resistance to common press room chemicals (chemical resistance). Often, the compositional features used to provide one desired property do not always improve other properties. While the imageable elements described in the patents, publications, and copending applications in the previous two paragraphs have provided useful advances in the art, additional improvements are still desired.

For example, for the positive-working lithographic printing plate precursors having a single imageable layer comprising a primary polymeric binder comprising recurring units of hydroxyaryl acetals or hydroxyaryl esters, the dry coating weight of the imageable layer can be greater than 1.5 g/m$^2$ in order to achieve desired imaging and printing properties.

While these precursors provide an advance in the art, there is a desire to bring further improvements to the industry. Particularly, it is desired to improve scratch resistance of the outer surface while reducing its slipperiness so the precursors can be easily stacked, with or without interleaf papers. When lithographic printing plate precursors have too slippery a printing surface, it is difficult to stack them neatly during manufacture and packaging operations.

There is also a desire to increase what is known in the art as the "imaging window" that is also known as "imaging latitude" and is generally defined as the difference between the linearity point and clearing point. The "linearity point" is the exposure energy where the measured tonal value on a 50% halftone tint on a processed lithographic printing plate equals 50%. The "clearing point" is the minimum exposure energy required for a predetermined alkaline developer to remove the imageable layer coating in a positive-working lithographic printing plate precursor such that the revealed underlying surface is no longer sensitive to lithographic printing inks. Wider imaging latitudes, for example of 20 mJ/cm$^2$ or more, are desired.

What can improve one of these features may not necessarily improve the others. It is a desired to find a way simultaneously to improve scratch resistance and imaging latitude while reducing slipperiness of the outermost printing surface.

SUMMARY OF THE INVENTION

This invention provides a positive-working lithographic printing plate precursor comprising a substrate, and disposed over this substrate, an outermost imageable layer, and the lithographic printing plate precursor further comprising an infrared radiation absorber, the outermost imageable layer having a dry coating weight of at least 0.7 g/m² and up to and including 1.6 g/m², and comprising:

a primary polymeric binder comprising recurring units of a hydroxyaryl acetal or a hydroxyaryl ester, or recurring units of both a hydroxyaryl acetal and a hydroxyaryl ester, an alkali-soluble secondary vinyl polymer other than the primary polymeric binder, and a non-polymeric polyhydric phenol.

In some embodiments, the positive-working lithographic printing plate precursor comprises an outermost imageable layer that has a dry coating weight of at least 1.1 g/m² and up to and including 1.4 g/m², the alkali-soluble secondary vinyl polymer has an acid number of at least 30 mg KOH/g of alkali-soluble secondary vinyl polymer and up to and including 170 mg KOH/g of alkali-soluble secondary vinyl polymer, and is a vinyl phenol copolymer, (meth)acrylic acid copolymer, a polymer that comprises recurring units capable of producing carboxylic acid upon heating or in the presence of acid, or a crotonic copolymer, the amount of the alkali-soluble secondary vinyl polymer and the amount of the non-polymeric polyhydric phenol in the outermost imageable layer are independently up to and including 10 weight %, the primary polymeric binder is present in the outermost imageable layer in an amount of at least 50 weight % and up to and including 95 weight %, and the polyhydric phenol is selected from the group consisting of quercetin, catechin hydrate, rutin hydrate, aloin, galic acid, chrysin, morn hydrate, and 2,2-bis(3-hydroxy-1,4-naphthoquinone).

The present invention also provides a method for preparing a lithographic printing plate, comprising:

imagewise exposing the positive-working lithographic printing plate of this invention, for example as described above, with infrared radiation to form exposed regions and non-exposed regions in the outermost imageable layer, and removing the exposed regions of the outermost imageable layer to provide a lithographic printing plate.

The present invention provides lithographic printing plate precursors having an outermost imageable layer that has a relatively lower coating weight without introduction of disadvantages usually associated with thinner layers. The precursors have improved scratch resistance and imaging latitude and lower slipperiness (higher coefficient of friction). These advantages are particularly useful in positive-working lithographic printing plate precursors having a single imageable layer comprising a polyvinyl acetal as the primary polymeric binder.

These advantages are achieved by including at least two additives in the imageable layer containing a primary polymeric binder as defined herein. One additive is a secondary polymeric binder that different from the primary polymeric binder and the other additive is a non-polymeric polyhydric phenol.

DETAILED DESCRIPTION OF THE INVENTION

Definitions

As used herein to define various components of the positive-working lithographic printing plate precursor, imageable layers, radiation-sensitive compositions, and processing solutions, unless otherwise indicated, the singular forms "a", "an", and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term's definition should be taken from a standard dictionary.

Unless the context otherwise indicates, when used herein, the terms "positive-working lithographic printing plate precursor" and "lithographic printing plate precursor" are meant to be references to embodiments used or prepared in the practice of the present invention.

The term "imageable element" refers to embodiments of this invention that are not necessarily lithographic printing plate precursors and that have alternative uses besides the preparation of lithographic printing plates.

Unless otherwise indicated, percentages refer to percents by weight. Percent by weight can be based on the total solids in a formulation or composition, or on the total dry coating weight of a layer, for example the outermost imageable layer.

As used herein, the term "infrared radiation absorbing compound" refers to compounds that are sensitive to at least one wavelength of near infrared and infrared radiation and can convert photons into heat within the layer in which they are disposed. These compounds can also be known in the art as "photothermal conversion materials", "sensitizers", or "light to heat convertors".

For clarification of definition of any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any different definitions set forth herein should be regarded as controlling.

The term "polymer" refers to high and low molecular weight polymers including oligomers and can include both homopolymers and copolymers.

The term "copolymer" refers to polymers that are derived from two or more different monomers, or have two or more different types of recurring units, even if derived from the same monomer. Unless otherwise noted, the different constitutional recurring units are present in random order along the copolymer backbone.

The term "backbone" refers to the chain of atoms in a polymer to which a plurality of pendant groups are attached. An example of such a backbone is an "all carbon" backbone obtained from the polymerization of one or more ethylenically unsaturated polymerizable monomers. However, other backbones can include heteroatoms.

Lithographic Printing Plate Precursors

The lithographic printing plate precursors are positive-working imageable elements so that imaged (exposed) regions in the oleophilic surface imageable layer are substantially removed during imaging and the non-imaged (non-exposed) regions of that layer remain in the imaging surface of the resulting lithographic printing plate.

Substrates:

In their simplest form, the lithographic printing plate precursors are formed by suitable application of one or more imageable layer formulations onto the substrate, which formulations are dried. One or more of the layer formulations can also be generally considered to have the capability of absorbing infrared radiation, for example containing an infrared radiation absorber as described below. More details of these manufacturing steps are provided below along with description of the various layers.

The substrate is usually treated or coated in various ways as described below prior to application of the first layer formulation. For example, the substrate can be treated to provide a subbing layer for improved adhesion or hydrophilicity, and an imageable layer formulation can be applied over this subbing layer.

The substrate generally has a hydrophilic surface, or a surface that is more hydrophilic than the applied imageable layer formulation on the imaging side. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal-containing supports include sheets or foils of aluminum, copper, zinc, titanium, and alloys thereof.

Polymeric film supports can be modified on one or both surfaces with a "subbing" layer to enhance hydrophilicity, or paper supports can be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

Particularly useful substrates are aluminum-containing supports that can be coated or treated using techniques known in the art, including physical graining, electrochemical graining and chemical graining, followed by anodizing. The aluminum sheets are mechanically or electrochemically grained and anodized using phosphoric acid or sulfuric acid and conventional procedures.

An interlayer can be formed on the support by treating it with, for example, a silicate, dextrin, calcium zirconium fluoride, hexafluorosilicic acid, phosphate/sodium fluoride, poly (vinyl phosphonic acid) (PVPA), vinyl phosphonic acid copolymer, poly(acrylic acid), or acrylic acid copolymer solution, or an alkali salt of a condensed aryl sulfonic acid as described in GB 2,098,627 and Japanese Kokai 57-195697A (both Hefting et al.). The grained and anodized aluminum support can be treated with poly(acrylic acid) using known procedures to improve surface hydrophilicity.

The thickness of the substrate can be varied but it should be sufficient to sustain the wear from printing and thin enough to wrap around a printing form.

The backside (non-imaging side) of the substrate can be coated with antistatic agents or slipping layer or matte layer to improve handling and "feel" of the imageable element.

The substrate can also be a cylindrical surface having one or more layers applied thereon, and thus be an integral part of the printing press. The use of such imaged cylinders is described for example in U.S. Pat. No. 5,713,287 (Gelbart).

Outermost Imageable Layer:

The lithographic printing plate precursor includes one or more non-crosslinked oleophilic polymers or polymeric binders that are considered the "primary" polymeric binders in the oleophilic surface (outermost imageable) layer. The weight average molecular weight ($M_w$) of the useful primary polymeric binders is generally at least 5,000 and can be up to 500,000 and typically at least 10,000 and up to and including 100,000 as measured by gel permeation chromatography (GPC).

Non-crosslinked oleophilic polymers useful as primary polymeric binders can be coated onto the substrate or underlayer by suitable formulation. In most embodiments, the primary polymeric binders comprise at least 15 mol % and up to and including 100 mol (based on total recurring units in the polymer) of recurring units represented by either or both of the following Structures (Ia) and (Ib):

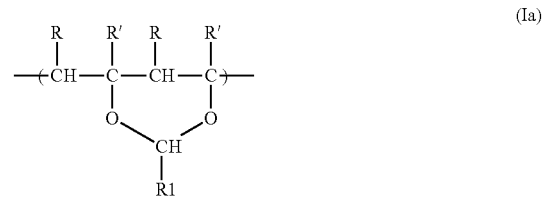

wherein R and R' are independently hydrogen or a substituted or unsubstituted alkyl group (generally having 1 to 10 carbon atoms), a substituted or unsubstituted cycloalkyl group (having 5 to 10 carbon atoms in the ring structure), or a halo group (such as fluoro, chloro, or bromo).

$R_1$ is a substituted or unsubstituted hydroxyaryl group such as a substituted or unsubstituted hydroxyphenyl or hydroxynaphthyl group wherein the aryl group has 1 to 3 hydroxyl groups on the ring. Typically, there is only 1 hydroxyl group on the aryl ring. Other substituents that can optionally be present on the aryl group include but are not limited to, alkyl, alkoxy, halogen, and any other group that does not adversely affect the performance of the primary polymeric binder in the lithographic printing plate precursor.

$R_2$ is a substituted or unsubstituted hydroxyaryl group that is substituted with a cyclic imide group, for example a substituted or unsubstituted hydroxyphenyl or hydroxynaphthyl group that has a cyclic imide substituent such as an aliphatic or aromatic imide group, including but not limited to, maleimide, phthalimide, tetrachlorophthalimide, hydroxyphthalimide, carboxypthalimide, and naphthalimide groups. Further optional substituents on $R_2$ include but are not limited to, hydroxyl, alkyl, alkoxy, halogen, and other groups that do not adversely affect the properties of the primary polymeric binder. A hydroxyphenyl group, with a cyclic imide substituent and no other substituents, is particularly useful in the primary polymeric binder.

The primary polymeric binders can comprise randomly recurring units represented by one or more or both Structures (Ia) and (Ib) described above and one or more recurring units represented by one or more of the following Structures (Ic), (Id), and (Ie), all in random arrangement in the primary polymer binder backbone:

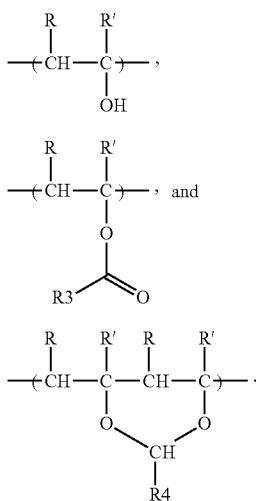

In all of these Structures, R and R' are as defined above for Structures (Ia) and (Ib), but each recurring unit need not comprise the same R and R' groups as the other recurring units in the chain.

In Structure (Id), $R_3$ is a substituted or unsubstituted linear or branched alkyl group having 1 to 12 carbon atoms (such as methyl, ethyl, n-propyl, n-butyl, n-pentyl, n-hexyl, chloromethyl, trichloromethyl, iso-propyl, iso-butyl, t-butyl, iso-pentyl, neo-pentyl, 1-methylbutyl, iso-hexyl, and dodecyl groups), a substituted or unsubstituted cycloalkyl having 5 to 10 carbon atoms in the carbocyclic ring (such as cyclopentyl, cyclohexyl, 4-methylcyclohexyl, and 4-chlorocyclohexyl), or a substituted or unsubstituted aryl group having 6 or 10 carbon atoms in the aromatic ring (such as phenyl, naphthyl, p-methylphenyl, and, p-chlorophenyl). Such groups can be substituted with one or more substituents such as alkyl, alkoxy, halo, and any other substituent that a skilled worker would readily contemplate that would not adversely affect the performance of the primary polymeric binder in the lithographic printing plate precursor.

In Structure (Ie), $R_4$ is a substituted or unsubstituted alkyl group having 1 to 12 carbon atoms or a cycloalkyl group having 5 or 6 carbon atoms in the carbo cyclic ring. The $R_4$ group can have further substituents such as amino, nitro, carboxy, alkoxy, or halogen groups, or any other group that does not adversely affect the properties of the primary polymeric binder.

When recurring units represented by any of Structures (Ic), (Id), and (Ie) are present, in random order, the recurring units represented by Structure (Ic) can be present in an amount of at least 2 mol % and up to including 60 mol % and typically at least 5 mol % and up to and including 60 mol %. The recurring units represented by Structure (Id) can be present in an amount of at least 1 mol % and up to and including 15 mol %, and typically of at least 2 mol % and up to and including 15 mol %. The recurring units represented by Structure (Ie) can be present in an amount of at least 2 mol % and up to and including 50 mol % and typically up to and including 30 mol %. All of these amounts are based on the total recurring units in the primary polymeric binder.

The primary polymeric binder can comprise the following recurring units, in random order, in the noted amounts, all based on the total recurring units in the resin:

Structure (Ia) recurring units in an amount of at least 10 and up to and including 50 mole %, Structure (Ib) recurring units in an amount of at least 15 mole % and including 70 mol %, Structure (Ic) recurring units in an amount of at least 2 mol % and up to and including 60 mol %, Structure (Id) recurring units in an amount of at least 1 mol % and up to and including 15 mol %, and Structure (Ie) recurring units in an amount of at least 2 mol % and up to and including 30 mol %.

While the primary polymeric binders useful in the oleophilic surface layer comprise at least recurring units represented by either or both of Structures (Ia) and (Ib), and optionally recurring units represented by Structures (Ic) through (Ie), such resins can also comprise randomly recurring units other than those defined by the illustrated recurring units and such additional recurring units would be readily apparent to a skilled worker in the art. Thus, the primary polymeric binders useful in this invention are not limited specifically to the recurring units defined by Structures (Ia) through (Ie).

The primary polymeric binders also can comprise multiple types of recurring units from any of the defined classes of recurring units in Structures (Ia), (Ib), (Ic), (Id), and (Ie) with different substituents. For example, there can be multiple types of recurring units with different R and R' groups, there can be multiple types of recurring units with different $R_1$ groups, there can be multiple types of recurring units with different $R_2$ groups, there can be multiple types of recurring units with different $R_3$ groups, or there can be multiple types of recurring units with different $R_4$ groups. In addition, while the number and type of recurring units in the primary polymeric binders are generally in random sequence, blocks of specific recurring units can also be present also.

The primary polymeric binder is generally present in the outermost imageable layer in an amount of at least 50 weight % and up to and including 95 weight % (or typically at least 55 and up to and including 80 weight %).

The primary polymeric binders can be prepared using known procedures using known starting materials as described for example in WO04/081662 (Memetea et al.) and U.S. Pat. Nos. 6,255,033, 6,541,181, and 7,723,012 (all Levanon et al.) all of which are incorporated herein by reference.

The outermost imageable layer also comprises at least 0.5 weight % and up to and including 10 weight % and typically at least 1 weight % and up to and including 6 weight % of one or more alkali-soluble secondary vinyl polymers. Each alkali-soluble secondary vinyl polymer has an acid number of at least 30 mg KOH/g of alkali-soluble secondary vinyl polymer and up to and including 170 mg KOH/g of alkali-soluble secondary vinyl polymer, or typically of at least 50 mg KOH/g of alkali-soluble secondary vinyl polymer and up to and including 170 mg KOH/g of alkali-soluble secondary vinyl polymer. The acid number is determined by titration with potassium hydroxide with known concentration, according to ISO 2114-1972 or DIN 53 402.

The alkali-soluble secondary vinyl polymers are not primary polymeric binders, meaning that they include less than 1 weight % of hydroxyaryl acetal and hydroxyaryl ester recurring units based on total alkali-soluble secondary vinyl polymer weight.

Useful alkali-soluble secondary vinyl polymers include but are not limited to, vinyl phenol copolymers comprising recurring units comprising substituted or unsubstituted phenol groups in the side chains. Such vinyl phenol copolymers can include copolymers comprising hydroxystyrene or branched hydroxystyrenes recurring units.

Other useful alkali-soluble secondary vinyl polymers include the following classes of copolymers having an acidic group in (1) through (5) shown below on a main chain or side chain (pendant group):

(1) sulfone amide (—SO$_2$NH—R'),
(2) substituted sulfonamido based acid group (hereinafter, referred to as active imido group) [such as —SO$_2$NHCOR', SO$_2$NHSO$_2$R', —CONHSO$_2$R'],
(3) carboxylic acid group (—CO$_2$H),
(4) sulfonic acid group (—SO$_3$H), and
(5) phosphoric acid group (—OPO$_3$H$_2$).

R' in the above-mentioned groups (1)-(5) represents hydrogen or a hydrocarbon group.

Particularly useful alkali-soluble secondary vinyl polymers include (meth)acrylic acid copolymers derived at least in part from (meth)acrylic acid. These are collectively referred to as (meth)acrylic copolymers. Other useful alkali-soluble secondary vinyl polymers include polymers that comprise recurring units that are capable of producing carboxylic acid upon heating or in the presence of an acid, or both heating and the presence of an acid. Still other useful alkali-soluble secondary vinyl polymers include crotonic copolymers derived at least in part from crotonic acid.

Specific useful alkali-soluble secondary vinyl polymers include but are not limited to, acrylic polymers such as those sold as Luvimer® 100P polymers (BASF), poly(4-vinyl phenol-co-2-hydroxyethyl methacrylate), poly(4-vinyl phenol-co-methyl methacrylate), and poly(vinyl acetate-co-crotonic acid).

The alkali-soluble secondary vinyl polymers can have a weight average molecular weight of at least 1,000 and a number average molecular weight of at least 500. Typically, the weight average molecular weight is at least 2,000 and up to and including 300,000, the number average molecular weight is at least 800 and up to and including 250,000. Weight average molecular weight and number average molecular weight are determined by GPC.

In addition to the primary polymeric binders and the alkali-soluble secondary vinyl polymers described above, the outermost imageable layer can also include one or more novolac or resole resins that are different than those polymers, in an amount of up to and including 20 weight %. Such polymers can be obtained from various commercial sources.

The outermost imageable layer also includes one or more non-polymeric polyhydric phenols that are compounds having a molecular weight of less than 1500 g/mole and generally at least 1000 g/mole. These compounds are generally defined as containing at least one but no more than two recurring phenolic units (aromatic core) and can be substituted by aliphatic, aromatic, or carbohydrate groups.

Examples of these non-polymeric polyhydric phenols include but are not limited to, quercetin [a flavanoid, 2-(3,4-dihydroxyphenyl)-3,5,7-trihydroxy-4H-chromen-4-one], catechin hydrate [cyanidol-3, (2R,3S)-2-(3,4,-dihydroxyphenyl)-3,4-dihydro-1(2H)-benzopyran-3,5,7-triol), rutin hydrate (quercetin-3-rutinoside hydrate, or Vitamin P hydrate), Aloin A [also known as Barbaloin, (10S)-10-glucopyranosyl-1,8-dihydroxy-3-(hydroxymethyl)-9(10H)-anthracenone], gallic acid (3,4,5-trihydroxybenzoic acid), chrysin (5,7-dihydroxyflavone or 5,7-dihydroxy-2-phenyl-4H-chromen-4-one), morin hydrate 2',3,4',5,7-pentahydroxyflavone hydrate), and 2,2 bis(3-hydroxy-1,4-naphthoquinone).

One or more non-polymeric polyhydric phenols are present in the outermost imageable layer in an amount of at least 1 weight % and up to and including 10 weight %, or typically at least 2 weight % and up to and including 5 weight %.

In some embodiments, the total amount of both of the alkali-soluble secondary vinyl polymer and the non-polymeric polyhydric phenol in the outermost surface layer is at least 1 weight % and up to and including 10 weight %. In addition, the weight ratio of the alkali-soluble secondary vinyl polymer to the non-polymeric polyhydric phenol can be at least 0.2:1 and up to and including 2:1.

In other embodiments, the amount of the alkali-soluble secondary vinyl polymer and the amount of the non-polymeric polyhydric phenol in the outermost imageable layer are independently up to and including 10 weight %.

The positive-working lithographic printing plate precursors comprise one or more one or more infrared radiation absorbers that are typically sensitive to near-infrared and infrared radiation of at least 700 nm and generally up to and including 1500 nm and typically of at least 750 nm and up to and including 1400 nm, or up to and including 1250 nm.

Useful infrared radiation absorbers include pigments such as carbon blacks including but not limited to carbon blacks that are surface-functionalized with solubilizing groups as well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful. Other useful carbon blacks are available from Cabot Billerica under the tradename Mogul. Other useful pigments include, but are not limited to, Heliogen Green, Nigrosine Base, iron (III) oxides, manganese oxide, Prussian Blue, and Paris Blue.

Examples of suitable infrared radiation-sensitive (IR) dyes as infrared radiation absorbers include but are not limited to, azo dyes, squarylium dyes, croconate dyes, triarylamine dyes, thioazolium dyes, indolium dyes, oxonol dyes, oxazolium dyes, cyanine dyes, merocyanine dyes, phthalocyanine dyes, indocyanine dyes, indotricarbocyanine dyes, hemicyanine dyes, streptocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo)-polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, polymethine dyes, squarine dyes, oxazole dyes, croconine dyes, porphyrin dyes, and any substituted or ionic form of the preceding dye classes. Suitable IR dyes are described for example, in U.S. Pat. Nos. 4,973,572 (DeBoer), 5,208,135 (Patel et al.), 5,244,771 (Jandrue Sr. et al.), and 5,401,618 (Chapman et al.), and EP 0 823 327A1 (Nagasaka et al.).

Cyanine dyes having an anionic chromophore are also useful. For example, the cyanine dye can have a chromophore having two heterocyclic groups. In another embodiments, the cyanine dyes can have from about two sulfonic acid groups, such as two sulfonic acid groups and two indolenine groups as described for example in U.S. Patent Application Publication 2005-0130059 (Tao).

Near infrared absorbing cyanine dyes are also useful and are described for example in U.S. Pat. Nos. 6,309,792 (Hauck et al.), 6,264,920 (Achilefu et al.), 6,153,356 (Urano et al.), and 5,496,903 (Watanabe et al.). Suitable dyes can be formed using conventional methods and starting materials or obtained from various commercial sources.

The infrared radiation absorbers are generally present in the positive-working lithographic printing plate precursors at a dry coverage of at least 0.1 weight % and up to and including 15 weight %, or typically in an amount of at least 1 weight % and up to and including 10 weight %. The particular amount needed for a particular precursor would be readily apparent to one skilled in the art, depending upon the specific compound used.

In those embodiments where the precursors comprise a single imageable layer that is the outermost imageable layer, the infrared radiation absorber is generally present in this single imageable layer. However, as described below, wherein the precursors include multiple imageable layers or interlayers, the infrared radiation absorber can be in any or all of the imageable layers or interlayers (such as either or both the inner imageable layer and the outermost imageable layer). In some multi-layer precursors comprising an inner imageable layer and the outermost imageable layer, the infrared radiation absorber can be present only in the inner imageable layer.

The outermost imageable layer can also include one or more additional compounds that are colorant dyes, or UV or visible light-sensitive components. Useful colorant dyes include triarylmethane dyes such as ethyl violet, crystal violet, malachite green, brilliant green, Victoria blue B, Victoria blue R, and Victoria pure blue BO, BASONYL® Violet 610 and D11 (PCAS, Longjumeau, France). These compounds can act as contrast dyes that distinguish the non-exposed (non-imaged) regions from the exposed (imaged) regions in the lithographic printing plate. When a colorant dye is present in the outermost imageable layer, its amount can vary widely, but generally it is present in an amount of at least 0.5 weight % and up to and including 30 weight %.

The outermost imageable layer can also include other addenda that would be useful for coating properties, coated layer physical properties, and adhesion to the substrate or underlying layer such as small organic molecules, oligomers, and surfactants. These additives can be generally present in the outermost imageable layer in an amount of at least 0.1 weight % and up to and including 30 weight %, or typically at least 2 weight % and up to and including 20 weight %. The outermost imageable layer can further include a variety of additives including dispersing agents, humectants, biocides, plasticizers, surfactants for coatability or other properties, viscosity builders, fillers and extenders, pH adjusters, drying agents, defoamers, preservatives, antioxidants, rheology modifiers or combinations thereof, or any other addenda commonly used in the lithographic art, in amounts known in the art.

The outermost imageable layer can also include a developability-enhancing compound. WO 2004/081662 (Memetea et al.) describes the use of various developability-enhancing compounds of acidic nature to enhance the sensitivity of positive-working imageable layer compositions so that required imaging energy for good cleanout is reduced.

A "developability-enhancing compound" is an organic compound that, when added to a positive-working radiation-sensitive imageable layer composition, reduces the minimum exposure energy required to completely remove the radiation-sensitive imageable layer in the exposed regions, in a suitable developer selected for that imageable layer, relative to the minimum exposure energy required to completely remove the same radiation-sensitive imageable layer in the exposed regions except for the exclusion of the organic compound. This difference will depend up on the particular organic compound and imageable layer composition used. In addition, such organic compounds can also be characterized as not substantially absorbing exposing radiation selected for the particular radiation-sensitive imageable layer, and generally have a molecular weight of less than 1000 g/mol.

Acidic Developability-Enhancing Compounds (ADEC), such as carboxylic acids or cyclic acid anhydrides, sulfonic acids, sulfinic acids, alkylsulfuric acids, phosphonic acids, phosphinic acids, phosphonic acid esters, phenols, sulfonamides, or sulfonimides can permit further improved developing latitude and printing durability. Representative examples of such compounds are provided in [0030] to [0036] of U.S. Patent Application Publication 2005/0214677 (Levanon et al.) that is incorporated herein by reference with respect to these acid developability-enhancing compounds.

The outermost imageable layer can also include a developability-enhancing composition containing one or more developability-enhancing compounds (DEC) as described in U.S. Patent Publication No. 2009/0162783 that is also incorporated herein by reference. Still other useful developability-enhancing compounds are also described in this publication using the following Structure ($DEC_1$):

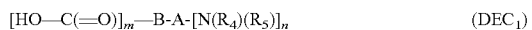

$$[HO-C(=O)]_m-B-A-[N(R_4)(R_5)]_n \quad (DEC_1)$$

wherein $R_4$ and $R_5$ in Structure $DEC_1$ are independently hydrogen or substituted or unsubstituted alkyl groups, substituted or unsubstituted cycloalkyl groups, or substituted or unsubstituted aryl groups, A is an organic linking group that comprises a substituted or unsubstituted phenylene directly attached to $-[N(R_4)(R_5)]_n$, B is a single bond or an organic linking group having at least one carbon, oxygen, sulfur, or nitrogen atom in the chain, m is an integer of 1 or 2, n is an integer of 1 or 2. The "B" organic linking group can be defined the same as A is defined above except that it is not required that B contain an arylene group, and usually B, if present, is different than A.

The one or more developability enhancing compounds described above are generally present in an amount of at least 1 weight % and up to and including 30 weight %, or typically at least 2 eight % and up to and including 20 weight %.

The outermost imageable layer can include one or more aminobenzoic acids, dimethylaminobenzoic acids, aminosalicyclic acids, indole acetic acids, anilinodiacetic acids, N-phenyl glycine, or any combination thereof as developability-enhancing compounds. For example, such compounds can include but are not limited to, 4-aminobenzoic acid, 4-(N, N'-dimethylamino)-benzoic acid, anilino(di)acetic acid, N-phenyl glycine, 3-indoleacetic acid, and 4-aminosalicyclic acid.

The outermost imageable layer is generally present at a dry coating weight (coverage) of at least 0.7 g/m² and up to and including 1.6 g/m², or typically of at least 1.1 g/m² and up to and including 1.5 g/m². In some embodiments, the dry coating weight is at least 1.1 g/m² and up to and including 1.4 g/m².

In some embodiments, the outermost imageable layer can be disposed over and chemically bonded to a crosslinked hydrophilic inner layer at their interface in a suitable manner. This crosslinked hydrophilic inner layer is not the usual inner imageable layer, but is applied to the substrate using known techniques. The chemical bonding can be accomplished through covalent bonds, intermolecular bonds, or both covalent bonds and intramolecular bonds. For example, chemical bonding can be accomplished through crosslinking agents such as those that are used to crosslink the hydrophilic binders in the crosslinked hydrophilic inner layer. Such crosslinking agents can be are selected from the group consisting of zirconium ammonium carbonate, ethane-1,2-dione, tetraethyl orthosilicate, tetramethyl orthosilicate, terephthalic aldehyde, and a melamine crosslinking agent. While there can be crosslinking at the interface of the two layers, the outermost imageable layer is generally non-crosslinked throughout.

The positive-working lithographic printing plate precursor can be prepared by disposing the outermost imageable layer formulation over the surface of the substrate (and any crosslinked hydrophilic layer provided thereon) using conventional coating or lamination methods. The outermost imageable layer formulation can be made by dispersing or dissolving the desired ingredients in a suitable coating solvent, and it is then applied to the substrate using suitable equipment and procedures, such as spin coating, knife coating, gravure coating, die coating, slot coating, bar coating, wire rod coating, roller coating, or extrusion hopper coating. The outermost imageable layer formulation can also be applied by spraying onto a suitable support (such as an onpress printing cylinder).

The selection of solvents used to coat the layer formulation(s) depends upon the nature of the primary polymeric binder, alkali-soluble secondary vinyl polymer, non-polymeric polyhydric phenol, and any optional components in the formulations. Generally, the outermost imageable layer formulation is coated out of acetone, methyl ethyl ketone, or another ketone, tetrahydrofuran, 1-methoxy-2-propanol, N-methylpyrrolidone, 1-methoxy-2-propyl acetate, γ-butyrolactone, and mixtures thereof using conditions and techniques well known in the art. A specific formulation is illustrated below in the Examples.

Some embodiments of the present invention are multi-layer positive-working lithographic printing plate precursors that comprise a substrate, an inner imageable layer (also known in the art as an "underlayer") disposed over the substrate, and the outermost imageable layer (also known in the art as a "top layer" or "topcoat") as described above. Before thermal imaging, the outermost imageable layer is generally not soluble or removable by an alkaline developer within the usual time allotted for development, but after thermal imaging, the exposed regions of the outermost imageable layer are soluble in the alkaline developer. The inner imageable layer is also generally removable by the alkaline developer. An infrared radiation absorber (described above) is also be present in such lithographic printing plate precursors, and can be present in either the outermost imageable layer, the inner imageable layer, or both the inner imageable layer and the outermost imageable layer. Alternatively, the infrared radiation absorber can be present in a separate layer between the inner imageable layer and the outermost imageable layer. Useful infrared radiation absorbers are described above. In most embodiments, the infrared radiation absorber is present only in the inner imageable layer.

Inner imageable layer formulations and compositions are described, for example, in U.S. Pat. Nos. 6,294,311 (Shimazu et al.), 6,352,812 (Shimazu et al.), 6,593,055 (Shimazu et al.), 6,352,811 (Patel et al.), 6,358,669 (Savariar-Hauck et al.), 6,528,228 (Savariar-Hauck et al.), 7,163,770 (Saraiya et al.), 7,163,777 (Ray et al.), 7,186,482 (Kitson et al.), 7,223,506 (noted above), 7,229,744 (Patel), 7,241,556 (Saraiya et al.), 7,247,418 (noted above), 7,291,440 (Ray et al.), 7,300,726 (Patel et al.), and 7,338,745 (Ray et al.), U.S. Patent Application Publications 2004/0067432 A1 (Kitson et al.) and 2005/0037280 (Loccufier et al.).

These multi-layer lithographic printing plate precursors are formed by suitable application of an inner imageable layer formulation onto a suitable substrate as described above. Generally, the inner imageable layer is disposed between the outermost imageable layer and the substrate. Typically, it is disposed directly on the substrate (including any hydrophilic coatings as described above). The inner imageable layer comprises one or more polymeric binders that are removable by a processing solution (described below) and typically soluble in that processing solution. In addition, the polymeric binders are usually insoluble in the solvent(s) used to coat the outermost imageable layer formulation so that the outermost imageable layer can be provided over the inner imageable layer without dissolving the inner imageable layer. Mixtures of these polymeric binders can be used if desired in the inner imageable layer. Such polymeric binders are generally present in the inner imageable layer in an amount of at least 10 weight %, and generally at least 60 weight % and up to and including 95 weight % of the total dry inner imageable layer coating weight.

Intermediate drying steps can be used between applications of the various layer formulations to remove solvent(s) before coating other formulations. Drying steps can also help in preventing the mixing of the various layers.

In such embodiments, the inner imageable layer can comprise an infrared or near-infrared radiation absorber (as described above) that absorbs radiation of at least 700 nm and up to and including 1500 nm and typically of at least 750 nm and up to and including 1400 nm. The infrared radiation absorber can be present in the multi-layer lithographic printing plate precursor for example in the inner imageable layer, in an amount of generally at least 0.5 weight % and up to and including 30 weight % and typically at least 3 weight % and up to and including 25 weight %, based on the total dry weight of the layer in which the infrared radiation absorber is located.

The outermost imageable layer of the imageable element is disposed over the inner imageable layer and in most embodiments there are no intermediate layers between these two layers. In some embodiments, the outermost imageable layer is substantially free of infrared radiation absorbers, meaning that none of these compounds are purposely incorporated therein and insubstantial amounts diffuse into it from other layers. However, as noted above, in other embodiments, the infrared radiation absorbing compound can be in both the outermost imageable layer and that inner imageable layers, as described for example in EP 1,439,058A2 (Watanabe et al.) and EP 1,738,901A1 (Lingier et al.), or in an intermediate layer as described above.

As described above, the outermost imageable layer can also include colorants as described for example in U.S. Pat. No. 6,294,311 (noted above) including triarylmethane dyes such as ethyl violet, crystal violet, malachite green, brilliant green, Victoria blue B, Victoria blue R, and Victoria pure blue BO. These compounds can act as contrast dyes that distinguish the non-exposed regions from the exposed regions in the developed precursor. The outermost imageable layer can optionally also include contrast dyes, printout dyes, coating surfactants, dispersing aids, humectants, biocides, viscosity builders, drying agents, defoamers, preservatives, and antioxidants.

The multi-layer lithographic printing plate precursors can be prepared by sequentially applying an inner imageable layer formulation over the surface of a substrate (or other hydrophilic layers), and then applying an outermost imageable layer formulation over the inner imageable layer using conventional coating or lamination methods. It is important to avoid intermixing of the inner imageable layer and outermost imageable layer formulations.

The inner imageable layer and outermost imageable layer formulations can be prepared by dispersing or dissolving the desired ingredients in a suitable coating solvent(s), and the resulting formulations are sequentially or simultaneously applied to the substrate using suitable equipment and procedures, such as spin coating, knife coating, gravure coating, die coating, slot coating, bar coating, wire rod coating, roller coating, or extrusion hopper coating. The formulations can also be applied by spraying onto the substrate.

Generally, an inner imageable layer formulation can be coated out of a solvent mixture of methyl ethyl ketone (MEK), 1-methoxy-2-propyl acetate (PMA), γ-butyrolactone (BLO), and water, a mixture of MEK, BLO, water, and 1-methoxypropan-2-ol (also known as Dowanol® PM or PGME), a mixture of diethyl ketone (DEK), water, methyl lactate, and BLO, a mixture of DEK, water, and methyl lactate, or a mixture of methyl lactate, methanol, and 1,3-dioxolane.

The outermost imageable layer formulation can be coated out of solvents or solvent mixtures that do not dissolve the inner layer. Typical solvents for this purpose include but are not limited to, butyl acetate, iso-butyl acetate, methyl iso-butyl ketone, DEK, 1-methoxy-2-propyl acetate (PMA), isopropyl alcohol, PGME, and mixtures thereof.

After drying, the lithographic printing plate precursors can be heat treated at a temperature of at least 40 and up to and including 90° C. (or typically at least 50 and up to and including 70° C.) for at least 4 hours and typically at least 20 hours, or for at least 24 hours. The maximum heat treatment time can be several days, but the optimal time and temperature for the heat treatment can be readily determined by routine experimentation. This heat treatment can also be known as a "conditioning" step. Details of such treatments are described for example, in EP 823,327 (Nagaska et al.) and EP 1,024,958 (McCullough et al.).

It can be desirable that during the heat treatment, the lithographic printing plate precursors are wrapped or encased in a water-impermeable sheet material to represent an effective barrier to moisture removal from the precursor. This sheet material is sufficiently flexible to conform closely to the shape of the precursor (or stack thereof) and is generally in close contact with the precursor (or stack thereof). Details of this process are provided in U.S. Pat. No. 7,175,969 (Ray et al.) that is incorporated herein by reference.

Imaging

The lithographic printing plate precursors can have any useful form including, but not limited to, printing plate sheets, printing cylinder precursors, printing sleeve precursors, and printing tapes (including flexible printing webs).

Lithographic printing plate precursors can be of any useful size and shape (for example, square or rectangular) having the requisite outermost imageable layer (and optionally inner imageable layer) disposed on a suitable substrate. Printing cylinders and sleeves are known as rotary printing members having the substrate and outermost imageable layer in a cylindrical form. Hollow or solid metal cores can be used as substrates for printing sleeves.

During use, the lithographic printing plate precursors can be exposed to a suitable source of infrared radiation depending upon the near-infrared or infrared radiation absorber present in one or more imageable layers, at a wavelength of at least 700 nm and up to and including 1500 nm. For most embodiments, imaging is carried out using an infrared laser at a wavelength of at least 750 nm and up to and including 1400 nm. The laser used to expose the lithographic printing plate precursor can be a diode laser, because of the reliability and low maintenance of diode laser systems, but other lasers such as gas or solid-state lasers can also be used. The combination of power, intensity and exposure time for laser imaging would be readily apparent to one skilled in the art. Presently, high performance lasers or laser diodes used in commercially available imagesetters emit infrared radiation at one or more wavelengths with the range of at least 750 nm and up to and including 1250 nm.

The imaging apparatus can function solely as a platesetter or it can be incorporated directly into a lithographic printing press. In the latter case, printing can commence immediately after imaging, thereby reducing press set-up time. The imaging apparatus can be configured as a flatbed recorder or as a drum recorder, with the lithographic printing plate precursor mounted to the interior or exterior cylindrical surface of the drum. A useful imaging apparatus is available as a Kodak® Trendsetter imagesetter available from Eastman Kodak Company that contain laser diodes that emit infrared radiation at a wavelength of about 830 nm. Other suitable imaging sources include the Crescent 42T Platesetter that operates at a wavelength of 1064 nm (available from Gerber Scientific, Chicago, Ill.), and the Screen PlateRite 4300 series or 8600 series platesetter or 8300 N-S (available from DaiNippon Screen, Chicago, Ill.). Additional useful sources of infrared radiation include direct imaging presses that can be used to image a precursor while it is attached to the printing plate cylinder. An example of a suitable direct imaging printing press includes the Heidelberg SM74-DI press (available from Heidelberg, Dayton, Ohio).

Infrared radiation imaging speeds (fluence) can be at least 40 $mJ/cm^2$ and up to and including 3000 $mJ/cm^2$ or typically at least 50 $mJ/cm^2$ and up to and including 500 $mJ/cm^2$.

While laser imaging is usually practiced, imaging can be provided by any other means that provides thermal (infrared) energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, as Fujitsu Thermal Head FTP-040 MCS001 and TDK Thermal Head F415 HH7-1089).

Imaging is generally carried out using direct digital imaging. The image signals are stored as a bitmap data file on a computer. Such data files can be generated by a raster image processor (RIP) or other suitable means. The bitmaps are constructed to define the hue of the color as well as screen frequencies and angles.

Processing and Printing

Imaging of the lithographic printing plate precursor produces an imaged precursor that comprises a latent image of imaged (exposed) and non-imaged (non-exposed) regions in at least the outermost imaging layer and in both the outermost imaging layer and the inner imageable layer for multi-layer precursors. Developing the imaged precursor with a suitable processing solution (for example, a developer) removes predominantly only the exposed regions in the precursor, for example in the outermost imageable layer and any layers underneath it, from the hydrophilic substrate. Thus, such lithographic printing plate precursors are "positive-working" and are used to provide lithographic printing plates exhibiting "positive" printing images.

Thus, processing (or development) is carried out off-press for a time sufficient to remove the imaged (exposed) regions, but not long enough to remove the non-imaged (non-exposed) regions in the outermost imageable layer of the precursor. The imaged (exposed) regions can be described as being "soluble" or "removable" in the processing solution (or developer) because they are removed, dissolved, or dispersed within the processing solution (or developer) more readily than the non-imaged (non-exposed) regions of the outermost imageable layer. Thus, the term "soluble" can also mean "dispersible".

The imaged precursors are generally processed using known processing conditions. Alkaline developers can be used that generally have a pH of at least 9 and typically a pH of at least 11, and up to and including 14. Useful alkaline developers include 3000 Developer, 9000 Developer, Gold-Star Developer, GoldStar Plus Developer, GoldStar Premium Developer, GREENSTAR Developer, ThermalPro Developer, PROTHERM Developer, MX1813 Developer, and MX1710 Developer (all available from Eastman Kodak Company), as well as Fuji HDP7 Developer (Fuji Photo) and Energy CTP Developer (Agfa). These compositions also generally include surfactants, chelating agents (such as salts of ethylenediaminetetraacetic acid), and various alkaline agents (such as inorganic metasilicates, organic metasilicates, hydroxides, and bicarbonates).

It is also possible use silicate- and metasilicate-free processing solutions as described for example in copending and commonly assigned in U.S. Ser. Nos. 12/948,808, 12/948,812, and 12/948,814 (all noted above) and incorporated herein by reference.

Generally, the processing solution (or developer) is applied to the imaged precursor by rubbing or wiping it with an applicator containing the processing solution. Alternatively, the imaged precursor can be brushed with the processing solution or the processing solution can be applied by spraying the imaged precursor with sufficient force to remove the exposed regions. Still again, the imaged precursor can be immersed in the processing solution. In all instances, a developed image is produced in a lithographic printing plate. Processing (or development) can be carried out in suitable apparatus containing suitable rollers, brushes, tanks, and plumbing for delivery, disposal, or recirculation of solutions if desired.

Useful processes for development includes those described for example in copending and commonly assigned U.S. Ser. No. 12/959,424 (filed Dec. 3, 2010 by Jarek, Balbinot, and Baumann), Ser. No. 12/959,440 (filed Dec. 3, 2010 buy Shrehmel, Piestert, and Baumann), and Ser. No. 13/022,714 (filed Feb. 8, 2011), all of which are incorporated herein by reference.

Following processing, the resulting lithographic printing plate can be rinsed with water and dried in a suitable fashion. The lithographic printing plate can also be treated with a conventional gumming solution (such as gum arabic).

The imaged and developed lithographic printing plate can also be baked in a post-exposure bake operation that can be carried out to increase run length. Baking can be carried out, for example at a temperature of at least 220° C. and up to and including 260° C. for at least 1 and up to and including 10 minutes, or for example at about 120° C. for about 30 minutes.

Printing can be carried out by applying a lithographic ink and fountain solution to the printing surface of the lithographic printing plate. The ink is taken up by the non-imaged (non-exposed or non-removed) regions of the outermost imageable layer and the fountain solution is taken up by the hydrophilic surface of the substrate revealed by the imaging and development process. The ink is then transferred to a suitable receiving material (such as cloth, paper, metal, glass, or plastic) to provide a desired impression of the image thereon. If desired, an intermediate "blanket" roller can be used to transfer the ink from the lithographic printing plate to the receiving material. The lithographic printing plates can be cleaned between impressions, if desired, using conventional cleaning means and chemicals.

The present invention provides at least the following embodiments and combinations thereof, but other combinations of features are considered to be within the present invention as a skilled artisan would appreciate from the teaching of this disclosure:

1. A positive-working lithographic printing plate precursor comprising a substrate, and disposed over this substrate, an outermost imageable layer, and the lithographic printing plate precursor further comprising an infrared radiation absorber, the outermost imageable layer having a dry coating weight of at least 0.7 g/m² and up to and including 1.6 g/m², and comprising:

a primary polymeric binder comprising recurring units of a hydroxyaryl acetal or a hydroxyaryl ester, or recurring units of both a hydroxyaryl acetal and a hydroxyaryl ester, an alkali-soluble secondary vinyl polymer that is not a primary polymeric binder, and a non-polymeric polyhydric phenol.

2. The precursor of embodiment 1 wherein the outermost imageable layer has a dry coating weight of at least 1.1 g/m² and up to and including 1.5 g/m².

3. The precursor of embodiment 1 or 2 wherein the alkali-soluble secondary vinyl polymer has an acid number of at least 30 mg KOH/g of alkali-soluble secondary vinyl polymer and up to and including 170 mg KOH/g of alkali-soluble secondary vinyl polymer.

4. The precursor of any of embodiments 1 to 3 wherein the amount of the alkali-soluble secondary vinyl polymer and the amount of the non-polymeric polyhydric phenol in the outermost imageable layer are independently up to and including 10 weight %.

5. The precursor of any of embodiments 1 to 4 wherein the primary polymeric binder is present in the outermost imageable layer in an amount of at least 50 weight % and up to and including 95 weight %.

6. The precursor of any of embodiments 1 to 5 wherein the primary polymeric binder comprises recurring units from either or both of Structures (Ia) and (Ib) so that the primary polymeric binder comprises at least 15 mol % and up to and including 100 mol % of either or both types of recurring units:

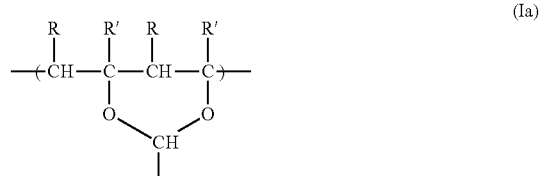

wherein R and R' are independently hydrogen or a substituted or unsubstituted alkyl group, a substituted or unsubstituted cycloalkyl group, or a halo group, $R_1$ is a substituted or unsubstituted hydroxyaryl group wherein the aryl group has 1 to 3 hydroxyl groups on the ring, and $R_2$ is a substituted or unsubstituted hydroxyaryl group that is substituted with a cyclic aliphatic or aromatic imide group.

7. The precursor of any of embodiments 1 to 6 wherein the alkali-soluble secondary vinyl polymer is a vinyl phenol copolymer, (meth)acrylic acid copolymer, a polymer that comprises recurring units capable of producing carboxylic acid upon heating or in presence of acid, or a crotonic copolymer.

8. The precursor of any of embodiments 1 to 7 wherein the polyhydric phenol is selected from the group consisting of quercetin, catechin hydrate, rutin hydrate, Aloin A, galic acid, chrysin, morin hydrate, and 2,2-bis(3-hydroxy-1,4-naphthoquinone).

9. The precursor of any of embodiments 1 to 8 comprising an inner imageable layer disposed over the substrate, and the outermost imageable layer is disposed over the inner imageable layer.

10. The precursor of embodiment 8 comprising the infrared radiation absorber in the inner imageable layer.

11. The precursor of any of embodiments 1 to 10 wherein:

the outermost imageable layer has a dry coating weight of at least 1.1 g/m² and up to and including 1.4 g/m², the alkali-soluble secondary vinyl polymer has an acid number of at least 30 mg KOH/g of alkali-soluble secondary vinyl polymer and up to and including 170 mg KOH/g of alkali-soluble secondary vinyl polymer, and is a vinyl phenol copolymer, (meth)acrylic acid copolymer, a polymer that comprises recurring units capable of producing carboxylic acid upon heating or in the presence of acid, or a crotonic copolymer, the amount of the alkali-soluble secondary vinyl polymer and the amount of the non-polymeric polyhydric phenol in the outermost imageable layer are independently up to and including 10 weight %, the primary polymeric binder is present in the outermost imageable layer in an amount of at least 50 weight % and up to and including 95 weight %, and the polyhydric phenol is selected from the group consisting of quercetin, catechin hydrate, rutin hydrate, Aloin A, galic acid, chrysin, morin hydrate, and 2,2-bis(3-hydroxy-1,4-naphthoquinone).

12. The precursor of any of embodiments 1 to 11 wherein the substrate is an aluminum substrate comprising a hydrophilic surface over which the outermost imageable layer is disposed.

13. A method for preparing a lithographic printing plate, comprising:

imagewise exposing the positive-working lithographic printing plate precursor of any of embodiments 1 to 12 with infrared radiation to form exposed regions and non-exposed regions in the outermost imaging layer, and removing the exposed regions of the outermost imaging layer to provide a lithographic printing plate.

14. The method of embodiment 13 comprising removing the exposed regions off-press using a processing solution.

15. The method of embodiment 13 or 14 comprising imagewise exposing the positive-working lithographic printing plate precursor using a laser and a fluence of at least 40 mJ/cm².

16. The method of any of embodiments 13 to 15 comprising removing the exposed regions from the outermost imageable layer using a silicate- and metasilicate-free processing solution.

The following Examples are provided to illustrate the practice of this invention and are not meant to be limiting in any manner. The following components were used in the preparation and use of these Examples:

| | |
|---|---|
| Polymer A | Identified below |
| BPA 1100 | Resole resin (23.4 weight %) available from AZ Electronic Chemicals GmbH (Germany) |
| IR Dye S 0094 | Infrared absorbing dye ($\lambda_{max}$ = 813 nm) available from FEW Chemicals |
| IR Dye S 00451 | Infrared absorbing dye ($\lambda_{max}$ = 775 nm) available from FEW Chemicals |
| Sudan Black B | Neutral diazo dye available from various sources |
| 4-ABA | 4-Aminobenzoic acid available from various sources |
| Luvimer ® 100P | Terpolymer prepared from t-butyl acrylate, ethyl acrylate, and methacrylic acid, available from BASF |
| TEGO ® Glide 450 | Surfactant, 10 weight % solution in PM, available from Evonik Tego Chemie |
| BLO | γ-Butyrolactone |
| MEK | Methyl ethyl ketone |
| PM | 1-Methoxy-2-propanol |
| Quercetin | Available from various sources |

Polymer A is represented by the following formula with a, b, c, and d as mol % and prepared using standard conditions and reactants as described above:

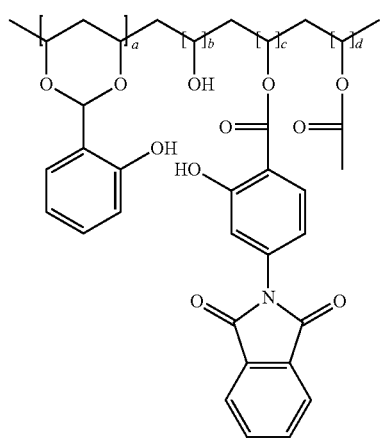

a = 16.5, b = 22, c = 38, d = 3

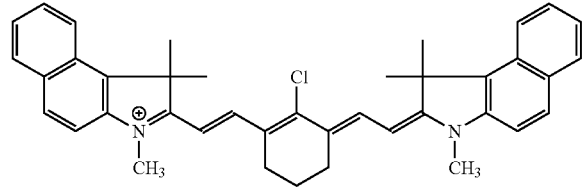

IR Dye S 0094

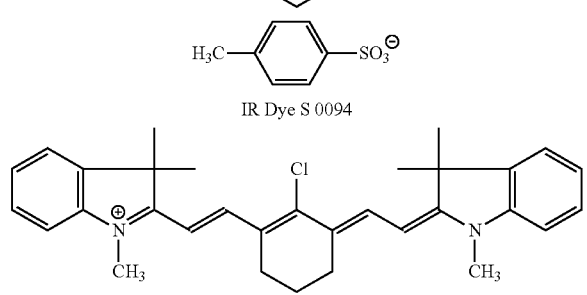

IR Dye S 0541

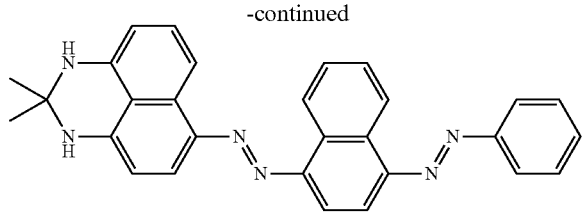

Sudan Black

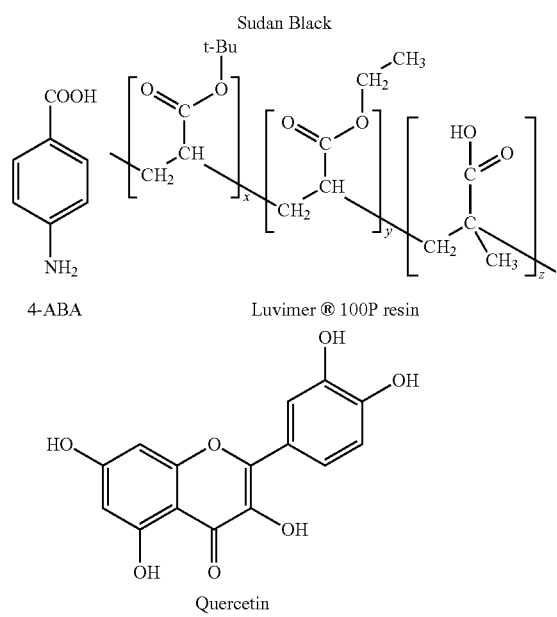

4-ABA      Luvimer ® 100P resin

Quercetin

Inventive Example 1

An invention imageable layer formulation was prepared using the following components:

| | |
|---|---|
| Polymer A | 4.917 g |
| BPA 1100 | 2.69 g |
| IR Dye S 0094 | 0.14 g |
| IR Dye S 0451 | 0.06 g |
| Sudan Black B | 0.28 g |
| Quercetin | 0.21 g |
| Luvimer ® 100P | 0.140 g |
| 4-ABA | 0.63 g |
| TEGO ® Glide 450 | 0.28 g |
| BLO | 18.6 g |
| 1,3-Dioxolane | 23.3 g |
| MEK | 23.35 g |
| PM | 25.6 g |

Comparative Example 1

A comparative imageable layer formulation was prepared using the following components (same as Invention Example 1 except for the omission of Luvimer® 100P resin and quercetin:

| | |
|---|---|
| Polymer A | 5.25 g |
| BPA 1100 | 2.70 g |
| IR Dye S 0094 | 0.119 g |
| IR Dye S 0451 | 0.063 g |
| Sudan Black B | 0.28 g |
| 4-ABA | 0.63 g |
| TEGO ® Glide 450 | 0.28 g |
| BLO | 18.6 g |
| 1,3-Dioxolane | 23.3 g |
| MEK | 23.3 g |
| PM | 25.6 g |

Comparative Example 2

Another comparative imageable layer formulation was prepared using the following components that were used in Comparative Example 1:

| | |
|---|---|
| Polymer A | 5.25 g |
| BPA 1100 | 2.70 g |
| IR Dye 094 | 0.119 g |
| IR Dye 451 | 0.063 g |
| Sudan Black B | 0.28 g |
| 4-ABA | 0.63 g |
| TEGO ® Glide 450 | 0.28 g |
| BLO | 18.6 g |
| 1,3-Dioxolane | 23.3 g |
| MEK | 23.3 g |
| PM | 25.6 g |

Each of the imageable layer formulations was filtered and applied to an electrochemically roughened and anodized aluminum substrate that had been subjected to a treatment with an aqueous solution of sodium phosphate/sodium fluoride by means of common methods and the resulting imageable layer coating was dried for 30 seconds at 135° C. in Glunz&Jensen "Unigraph Quartz" oven to provide lithographic printing plate precursors. The outermost imageable layers for Invention Example 1 and Comparative Example 1 had a dry coating coverage of 1.15 g/m$^2$, and the outermost imageable layer for Comparative Example 2 had a dry coating coverage of 1.5 g/m$^2$.

After the imageable layers were coated, they were heat treated at a temperature of 62° C. and a relative humidity of 28% RH for 24 hours.

The resulting lithographic printing plate precursors were exposed on a Screen PlateRite 8300 N-S imager (available from DaiNippon Screen, Chicago, USA) at a range of energies of from 70 mJ/cm$^2$ to 120 mJ/cm$^2$ and developed (processed) for 23 seconds (exact time) at 23° C. in a Mercury V6 processor using 400 xLo Kodak® Developer. The resulting lithographic printing plates were evaluated for sensitivity (Clearing Point: the lowest imaging energy at which the exposed regions were completely removed by the developer at a given temperature and time), Linearity Point (the energy at which the 50% dots at 200 lpi screen are reproduced as 50%±0.2% dots), and Imaging Latitude (difference between linearity point and clearing point, mJ/cm$^2$).

In addition, the Coefficient of Friction was measured by placing a block of specified weight on tilted plane and the angle of tilt was increased until the block began to slide. The tangent of the tilting angle θ is considered the cold "friction angle". This angle θ is related to the coefficient of friction μ, by μ=tan θ. Desired coefficient of friction values are at least 0.3.

Scratch Sensitivity was evaluated by placing a 1500 gram weight on the undeveloped lithographic printing plate precursor plate with interleaf paper placed between the 1500 gram weight and the precursor surface, covering a precursor surface area of 10 cm². The 1500 gram weight was pulled, together with interleaf paper, over the precursor surface at a constant speed. Then, precursor was developed under appropriate conditions (developer, temperature and processing speed) in order to visualize any scratch marks. This evaluation of scratch marks was rated from 1 to 4 with 1 meaning "low" and 4 meaning "high" according to a visual observation. The lower values are desirable.

The results are shown below in TABLE I.

TABLE I

| Example | Linearity Point (mJ/cm²) | Clearing Point (mJ/cm²) | Imaging Latitude (mJ/cm²) | Coefficient of friction | Scratch Sensitivity (low 1, high 4) |
|---|---|---|---|---|---|
| Inventive Example 1 | 88 | 75 | 18 | 0.36 | 1 |
| Comparative Example 1 | 90 | 100 | −10 | 0.38 | 1 |
| Comparative Example 2 | 92 | 70 | 22 | <0.12 | 1 |

The data in TABLE I show that the lithographic printing plate prepared with a relatively high coating weight (Comparative Example 2) had good scratch resistance and imaging latitude but it exhibited a low coefficient of friction so that it was difficult to manufacture. The lithographic printing plate prepared in Comparative Example 1 had a lower coating weight in the imageable layer. It exhibited good scratch resistance and a high coefficient of friction but it failed to exhibit good imaging latitude. In contrast, the lithographic printing plate prepared according to the present invention in Invention Example 1 had a relatively thin coating weight in the imageable layer that contained both the desired Luvimer® 100P terpolymer and the quercetin additive. It exhibited good characteristics for all measured parameters: good scratch resistance, sufficient coefficient of friction, and broad imaging latitude.

The invention has been described in detail with particular reference to certain preferred embodiments thereof, but it will be understood that variations and modifications can be effected within the spirit and scope of the invention.

The invention claimed is:

1. A positive-working lithographic printing plate precursor comprising a substrate, and disposed over this substrate, an outermost imageable layer, and the lithographic printing plate precursor further comprising an infrared radiation absorber, the outermost imageable layer having a dry coating weight of at least 0.7 g/m² and up to and including 1.6 g/m², and comprising:

a primary polymeric binder, an alkali-soluble secondary vinyl polymer that is not a primary polymeric binder, and a non-polymeric polyhydric phenol, wherein the primary polymeric binder comprises recurring units from either or both of Structures (Ia) and (Ib) so that the primary polymeric binder comprises at least 15 mol % and up to and including 100 mol % of both types of recurring units:

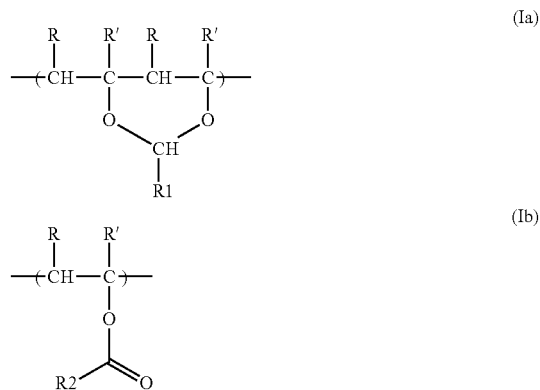

wherein R and R' are independently hydrogen or a substituted or unsubstituted alkyl group, a substituted or unsubstituted cycloalkyl group, or a halo group, $R_1$ is a substituted or unsubstituted hydroxyaryl group wherein the aryl group has 1 to 3 hydroxyl groups on the ring, and $R_2$ is a substituted or unsubstituted hydroxyaryl group that is substituted with a cyclic aliphatic or aromatic imide group, and further that the Structure (Ia) recurring units are present in an amount of at least 10 mol % and up to and including 50 mol % and the Structure (Ib) recurring units are present in an amount of at least 15 mol % and up to and including 70 mol %, based on total recurring units.

2. The precursor of claim 1 wherein the outermost imageable layer has a dry coating weight of at least 1.1 g/m² and up to and including 1.5 g/m².

3. The precursor of claim 1 wherein the alkali-soluble secondary vinyl polymer has an acid number of at least 30 mg KOH/g of alkali-soluble secondary vinyl polymer and up to and including 170 mg KOH/g of alkali-soluble secondary vinyl polymer.

4. The precursor of claim 1 wherein the amount of the alkali-soluble secondary vinyl polymer and the amount of the non-polymeric polyhydric phenol in the outermost imageable layer are independently up to and including 10 weight %.

5. The precursor of claim 1 wherein the primary polymeric binder is present in the outermost imageable layer in an amount of at least 50 weight % and up to and including 95 weight %.

6. The precursor of claim 1 wherein the alkali-soluble secondary vinyl polymer is a vinyl phenol copolymer, (meth) acrylic acid copolymer, a polymer that comprises recurring units capable of producing carboxylic acid upon heating or in presence of acid, or a crotonic copolymer.

7. The precursor of claim 1 wherein the polyhydric phenol is selected from the group consisting of quercetin, catechin hydrate, rutin hydrate, Aloin A, gallic acid, chrysin, morin hydrate, and 2,2-bis(3-hydroxy-1,4-naphthoquinone).

8. The precursor of claim 1 comprising an inner imageable layer disposed over the substrate, and the outermost imageable layer is disposed over the inner imageable layer.

9. The precursor of claim 8 comprising the infrared radiation absorber in the inner imageable layer.

10. The precursor of claim 1 wherein:

the outermost imageable layer has a dry coating weight of at least 1.1 g/m² and up to and including 1.4 g/m², the alkali-soluble secondary vinyl polymer has an acid number of at least 30 mg KOH/g of alkali-soluble secondary vinyl polymer and up to and including 170 mg KOH/g of alkali-soluble secondary vinyl polymer, and is a vinyl phenol copolymer, (meth)acrylic acid copolymer, a polymer that comprises recurring units capable of producing carboxylic acid upon heating or in the presence of acid, or a crotonic copolymer, the amount of the alkali-soluble secondary vinyl polymer and the amount of the non-polymeric polyhydric phenol in the outermost imageable layer are independently up to and including 10 weight %, the primary polymeric binder is present in the outermost imageable layer in an amount of at least 50 weight % and up to and including 95 weight %, and the polyhydric phenol is selected from the group consisting of quercetin, catechin hydrate, rutin hydrate, Aloin A, gallic acid, chrysin, morin hydrate, and 2,2-bis(3-hydroxy-1,4-naphthoquinone).

11. The precursor of claim 10 that further comprises an inner imageable layer disposed over the substrate, and the outermost imageable layer is disposed over the inner imageable layer.

12. The precursor of claim 11 wherein the infrared radiation absorber is present only in the inner imageable layer.

13. The precursor of claim 1 wherein the substrate is an aluminum substrate comprising a hydrophilic surface over which the outermost imageable layer is disposed.

14. A method for preparing a lithographic printing plate, comprising:

imagewise exposing the positive-working lithographic printing plate precursor of claim 1 with infrared radiation to form exposed regions and non-exposed regions in the outermost imageable layer, and removing the exposed regions of the outermost imageable layer to provide a lithographic printing plate.

15. The method of claim 14 comprising removing the exposed regions off-press using a processing solution.

16. The method of claim 14 comprising imagewise exposing the positive-working lithographic printing plate precursor using a laser and a fluence of at least 40 mJ/cm$^2$.

17. The method of claim 14 wherein the lithographic printing plate precursor comprises an inner imageable layer disposed over the substrate, and the outermost imageable layer is disposed over the inner imageable layer.

18. The method of claim 14 comprising removing the exposed regions from the outermost imageable layer using a silicate- and metasilicate-free processing solution.

19. A method for preparing a lithographic printing plate, comprising:

imagewise exposing the positive-working lithographic printing plate precursor of claim 10 with infrared radiation to form exposed regions and non-exposed regions in the outermost imaging layer, and removing the exposed regions of the outermost imaging layer to provide a lithographic printing plate.

20. The method of claim 19 comprising removing the exposed regions from the outermost imageable layer using a silicate- and metasilicate-free processing solution.

* * * * *